(12) United States Patent
Tang et al.

(10) Patent No.: US 8,791,743 B1
(45) Date of Patent: Jul. 29, 2014

(54) BALANCED LEVEL SHIFTER WITH WIDE OPERATION RANGE

(71) Applicant: Apple Inc., Cupertino, CA (US)

(72) Inventors: Bo Tang, Sunnyvale, CA (US); Huaimin Li, San Jose, CA (US); Ajay Kumar Bhatia, Saratoga, CA (US)

(73) Assignee: Apple Inc., Cupertino, CA (US)

( * ) Notice: Subject to any disclaimer, the term of this patent is extended or adjusted under 35 U.S.C. 154(b) by 0 days.

(21) Appl. No.: 13/769,406

(22) Filed: Feb. 18, 2013

(51) Int. Cl.
    *H03L 5/00* (2006.01)
(52) U.S. Cl.
    USPC ............................... 327/333; 326/80; 326/81
(58) Field of Classification Search
    USPC ........................................ 327/333; 326/80, 81
    See application file for complete search history.

(56) References Cited

U.S. PATENT DOCUMENTS

| | | | |
|---|---|---|---|
| 5,541,532 A * | 7/1996 | McCall | 326/68 |
| 5,777,501 A * | 7/1998 | AbouSeido | 327/274 |
| 5,926,396 A | 7/1999 | Ohara | |
| 5,994,921 A * | 11/1999 | Hedberg | 326/81 |
| 7,586,339 B2 | 9/2009 | Oh et al. | |
| 7,667,522 B1 * | 2/2010 | Maung | 327/333 |
| 7,777,521 B2 * | 8/2010 | Hanna et al. | 326/68 |
| 8,013,656 B2 * | 9/2011 | Kanno et al. | 327/333 |
| 8,278,969 B2 | 10/2012 | Ng et al. | |
| 2012/0134439 A1 | 5/2012 | Sato et al. | |

* cited by examiner

*Primary Examiner* — Kenneth B. Wells
(74) *Attorney, Agent, or Firm* — Meyertons, Hood, Kivlin, Kowert & Goetzel, P.C.

(57) ABSTRACT

Embodiments of an apparatus are disclosed that may allow for the translation of signals from one power domain to another with well-balanced rise and fall times over a wide operational range. The apparatus may include an input buffer, a voltage shift circuit, and output circuit, and an output driver. The input buffer may be configured to generate a buffered version and delayed inverted version of an external signal at a first voltage level. The voltage shift circuit may be configured to generate two internal signals at a second voltage level dependent upon the output signals of the input buffer. The output circuit may be configured to generate two output driver signals at the second voltage level dependent upon the output signals of the voltage shift circuit. The output driver circuit may be configured to generate an output signal at the second voltage level dependent on the two output driver signals.

15 Claims, 8 Drawing Sheets

BALANCED LEVEL SHIFTER WITH WIDE OPERATION RANGE

BACKGROUND

1. Technical Field

This invention is related to the field of integrated circuit implementation, and more particularly to the implementation of multiple power domains and voltage-level shifting of signals transmitted between various power domains.

2. Description of the Related Art

Computing systems may include one or more systems-on-a-chip (SoC), which may integrate a number of different functions, such as, graphics processing, onto a single integrated circuit. With numerous functions included in a single integrated circuit, chip count may be kept low in mobile computing systems, such as tablets, for example, which may result in a smaller form factor for such mobile computing systems.

As semiconductor process technology has continued to evolve, device geometries continue to shrink, allowing a higher density of devices per unit area. With an increased density of devices, increased levels of integration may be possible, allowing for more functional blocks with increased complexity to be integrated into a single SoC.

With higher levels of integration and higher performing devices, power consumption may be a limiting factor, particularly in mobile computing applications such as, e.g., tablets or cellular telephones. Different design techniques and architectures may be employed to limit leakage or dynamic power. Some SoC designs may employ multiple power supply voltages for various functional blocks or sub-blocks within such designs.

SUMMARY OF THE EMBODIMENTS

Various embodiments of a level shift circuit are disclosed. Broadly speaking, a circuit and a method are contemplated in which an apparatus includes an input buffer, a voltage shift circuit, an output circuit, and an output driver. The input buffer may be configured to generate, dependent upon an external signal, a buffered external signal at a first voltage level, and a delayed inverted external at the first voltage level. The voltage shift circuit may be configured to generate first and second internal signals at a second voltage level dependent upon the buffered external signal and the delayed inverted external signal. The output circuit may be configured to generate, dependent upon the first internal signal and the second internal signal, a first output driver signal at the second voltage level, and a second output driver signal at the second voltage level. The output driver may be configured to generate an output signal at the second voltage level dependent upon the first output driver signal and the delayed second output driver signal.

In another embodiment, the input buffer may include an inverting amplifier. The inverting amplifier may be configured to generate the inverted external signal dependent upon the external signal.

In a further embodiment, the input buffer may include a delay circuit. The delay circuit may be configured to generate the delayed inverted external signal dependent upon the inverted external signal.

BRIEF DESCRIPTION OF THE DRAWINGS

The following detailed description makes reference to the accompanying drawings, which are now briefly described.

While the disclosure is susceptible to various modifications and alternative forms, specific embodiments thereof are shown by way of example in the drawings and will herein be described in detail. It should be understood, however, that the drawings and detailed description thereto are not intended to limit the disclosure to the particular form illustrated, but on the contrary, the intention is to cover all modifications, equivalents and alternatives falling within the spirit and scope of the present disclosure as defined by the appended claims. The headings used herein are for organizational purposes only and are not meant to be used to limit the scope of the description. As used throughout this application, the word "may" is used in a permissive sense (i.e., meaning having the potential to), rather than the mandatory sense (i.e., meaning must). Similarly, the words "include," "including," and "includes" mean including, but not limited to.

Various units, circuits, or other components may be described as "configured to" perform a task or tasks. In such contexts, "configured to" is a broad recitation of structure generally meaning "having circuitry that" performs the task or tasks during operation. As such, the unit/circuit/component can be configured to perform the task even when the unit/circuit/component is not currently on. In general, the circuitry that forms the structure corresponding to "configured to" may include hardware circuits. Similarly, various units/circuits/components may be described as performing a task or tasks, for convenience in the description. Such descriptions should be interpreted as including the phrase "configured to." Reciting a unit/circuit/component that is configured to perform one or more tasks is expressly intended not to invoke 35 U.S.C. §112, paragraph six interpretation for that unit/circuit/component. More generally, the recitation of any element is expressly intended not to invoke 35 U.S.C. §112, paragraph six interpretation for that element unless the language "means for" or "step for" is specifically recited.

DETAILED DESCRIPTION OF EMBODIMENTS

To manage power and performance within an SoC, one or more power domains may be employed. The use of multiple power domains may allow for power to be reduced or shut off to functional blocks that are inactive. For example, a functional block may be operated a higher voltage level during certain tasks, and then operated at a lower voltage level when the tasks have completed. In some cases, data or clock signals may need to move between power domains with different power supply voltage levels. Level shift circuits may be employed to translate such signals from the voltage level of one power domain to the voltage level of another power domain.

Variation resulting from a semiconductor manufacturing process may result in variation in the operation of level shift circuits, resulting in distortion in signals output from the level shift circuits. Power supply noise and temperature variation may also contribute to the distortion in the level shift circuits.

When the voltage level of a clock signal is translated by a level shift circuit, the duty cycle of the clock signal output by the level shift circuit may be distorted (commonly referred to as "duty cycle distortion"), which may result in timing failures within a functional block of an SoC.

Design techniques, such as, matching gate delays and load balancing, may be employed in level shift circuits to reduce variation in the output of such circuits. The embodiments illustrated in the drawings and described below may provide techniques for the providing and operating level shift circuits within an integrated circuit while limiting distortion on the output of the level shift circuit.

System-on-a-Chip Overview

Figure 1:
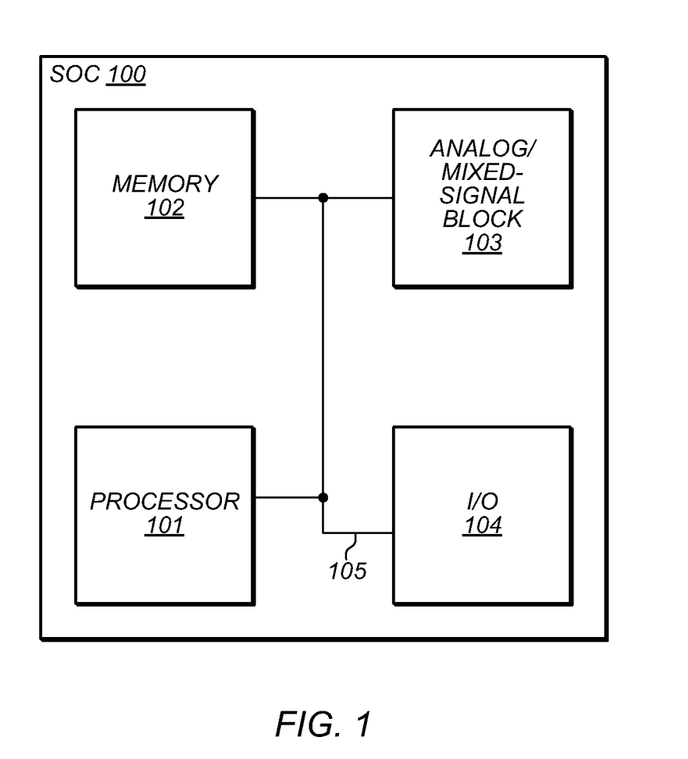
FIG. 1 illustrates an embodiment of a system-on-a-chip.

A block diagram of an SoC is illustrated in FIG. 1. In the illustrated embodiment, the SoC 100 includes a processor 101 coupled to memory block 102, and analog/mixed-signal block 103, and I/O block 104 through internal bus 105. In various embodiments, SoC 100 may be configured for use in a mobile computing application such as, e.g., a tablet computer or cellular telephone. Transactions on internal bus 105 may be encoded according to one of various communication protocols. For example, transactions may be encoded using Advanced Extensible Interface (AXI), Peripheral Component Interconnect Express (PCIe), or any other suitable communication protocol.

Processor 101 may, in various embodiments, be representative of a general-purpose processor that performs computational operations. For example, processor 101 may be a central processing unit (CPU) such as a microprocessor, a microcontroller, an application-specific integrated circuit (ASIC), or a field-programmable gate array (FPGA). In some embodiments, processor 101 may include one or more register files and memories.

In some embodiments, processor 101 may implement any suitable instruction set architecture (ISA), such as, e.g., the ARM™, PowerPC™, or x86 ISAs, or combination thereof. Processor 101 may include one or more bus transceiver units that allow processor 101 to communication to other functional blocks within SoC 100 such as, memory block 102, for example.

Memory block 102 may include any suitable type of memory such as a Dynamic Random Access Memory (DRAM), a Static Random Access Memory (SRAM), a Read-only Memory (ROM), Electrically Erasable Programmable Read-only Memory (EEPROM), a FLASH memory, Phase Change Memory (PCM), or a Ferroelectric Random Access Memory (FeRAM), for example. In some embodiments, memory block 102 may be configured to store program code or program instructions that may be executed by processor 101. Memory block 102 may, in other embodiments, be configured to store data to be processed, such as graphics data, for example.

It is noted that in the embodiment of an SoC illustrated in FIG. 1, a single memory block is depicted. In other embodiments, any suitable number of memory blocks and memory types may be employed.

Analog/mixed-signal block 103 may include a variety of circuits including, for example, a crystal oscillator, a voltage reference, a current reference, a phase-locked loop (PLL) or delay-locked loop (DLL), an analog-to-digital converter (ADC), and a digital-to-analog converter (DAC) (all not shown). In other embodiments, analog/mixed-signal block 103 may be configured to perform power management tasks with the inclusion of on-chip power supplies, voltage regulators, and clock frequency scaling circuitry. Analog/mixed-signal block 103 may also include, in some embodiments, radio frequency (RF) circuits that may be configured for operation with cellular telephone networks.

I/O block 104 may be configured to coordinate data transfer between SoC 101 and one or more peripheral devices. Such peripheral devices may include, without limitation, storage devices (e.g., magnetic or optical media-based storage devices including hard drives, tape drives, CD drives, DVD drives, etc.), audio processing subsystems, graphics processing subsystems, or any other suitable type of peripheral devices. In some embodiments, I/O block 104 may be configured to implement a version of Universal Serial Bus (USB) protocol or IEEE 1394 (Firewire®) protocol, and may allow for program code and/or program instructions to be transferred from a peripheral storage device for execution by processor 101.

I/O block 104 may also be configured to coordinate data transfer between SoC 301 and one or more devices (e.g., other computer systems or SoCs) coupled to SoC 100 via a network. In one embodiment, I/O block 104 may be configured to perform the data processing necessary to implement an Ethernet (IEEE 802.3) networking standard such as Gigabit Ethernet or 10-Gigabit Ethernet, for example, although it is contemplated that any suitable networking standard may be implemented. In some embodiments, I/O block 104 may be configured to implement multiple discrete network interface ports.

Each of the functional blocks included in SoC 100 may be included in separate power and/or clock domains. In some embodiments, a functional block may be further divided into smaller power and/or clock domains. Each power and/or clock domain may, in some embodiments, be separately controlled thereby selectively deactivating (either by stopping a clock signal or disconnecting the power) individual functional blocks or portions thereof.

It is noted that the SoC illustrated in FIG. 1 is merely an example. In other embodiments, different functional blocks and different configurations of functions blocks may be possible dependent upon the specific application for which the SoC is intended.

Level Shifting Signals Between Power Domains

Figure 2:
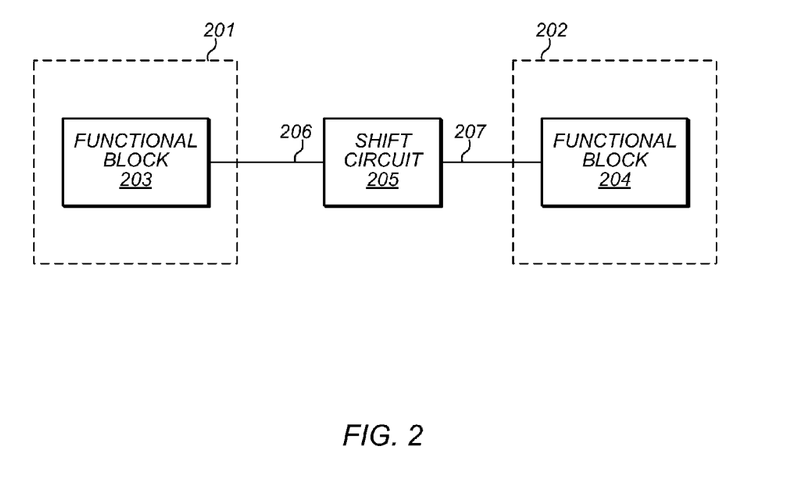
FIG. 2 illustrates an embodiment of separate power domains with a system-on-a-chip.

Turning to FIG. 2, an embodiment of separate power domains with a system-on-a-chip is illustrated. The illustrated embodiment includes power domain 201, power domain 202, and level shift circuit 205. Power domain 201 includes circuit block 203, and power domain 202 includes circuit block 204. In some embodiments, circuit blocks 203 and 204 may correspond to one or more functional blocks, such as memory 102 of SoC 100 as illustrated in FIG. 1. In other embodiments, circuit blocks 203 and 204 may correspond to a portion of a functional block of an SoC, and may includes one or more sub-blocks of a synthesized place-and-route logic circuit, a full-custom circuit design, or any other suitable circuit.

Data signals included within circuit block 203 (not shown) may transition between a voltage level at or near ground potential and a voltage level at or near the potential of the power supply for power domain 201. Similarly, data signals included within circuit block 204 (not shown) may transition between a voltage level at or near ground potential and a voltage level at or near the potential of the power supply for power domain 202. In some embodiments, the voltage level of the power supply for power domain 201 may be different than the voltage level of the power supply for power domain 202. In such cases, a high logic level within circuit block 203 may not be at the same voltage level as a high logic level within circuit block 24.

It is noted that "low" or "low logic level" refers to a voltage at or near ground and that "high" or "high logic level" refers to a voltage level at or near the voltage level of the power supply within a power domain. In other embodiments, different technology may result in different voltage levels for "low" and "high."

In some embodiments, data signals, such as, e.g., signal 206, may need to be transmitted from one circuit block to another across power domain boundaries. Such data signals may need to be converted (as referred to herein as "shifted") such that their high logic level is appropriate for the destination circuit. The conversion may, in some embodiments, involve increasing the voltage level of the high logic level. In other embodiments, the conversion may involve decreasing the to voltage level of the high logic level.

Conversion of signals may occur in a level shift circuit, such as, shift circuit 205 as illustrated in FIG. 2, for example. Shift circuit 205 may convert the voltage level of signal 206, thereby creating signal 207. In some embodiments, the voltage level of the high logic level of signal 207 may be at or near the power supply for power domain 202.

Signal 206 may, in some embodiments, be a data signal, while in other embodiments, signal 206 may be clock signal. It is noted that although only one signal is shown as originating from functional block 203, in some embodiments, numerous signals and busses may originate from functional block 203 and may be converted to a voltage level appropriate for their respective destination circuit blocks.

It is noted that diagram illustrated in FIG. 2 is merely an example. In other embodiments, different numbers of power domains, different numbers of shift circuits, and different numbers of signals may be employed.

Figure 3:
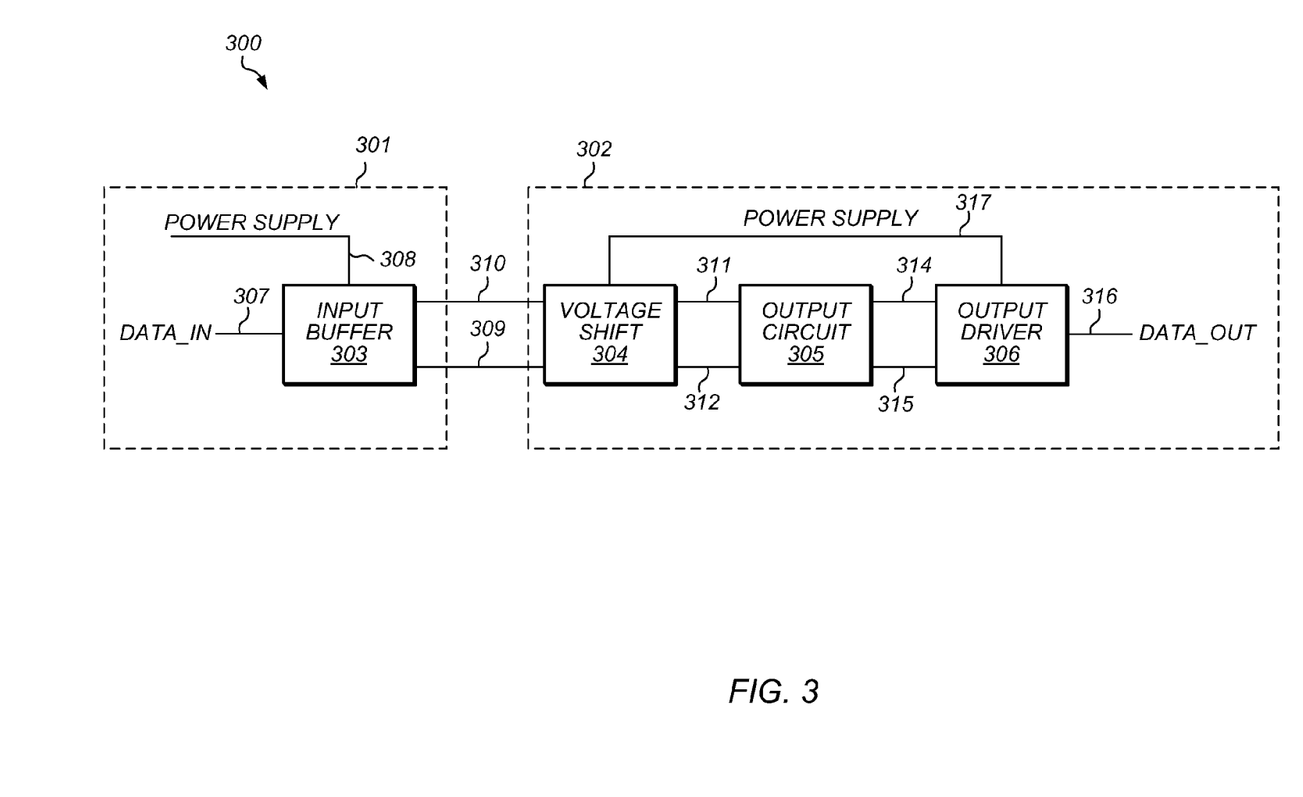
FIG. 3 illustrates an embodiment of a level shift circuit.

Turning to FIG. 3, an embodiment of a level shift circuit is illustrated. In some embodiments, level shift circuit 300 may correspond to level shift circuit 205 as illustrated in FIG. 2. The illustrated embodiment includes input buffer 303, voltage shift circuit 304, output circuit 305, and output driver 306. Input buffer 303 is coupled to power supply 308 within power domain 301. Voltage shift circuit 304, output buffer 305, and output driver 306 are coupled to power supply 317 within power domain 302.

Data input 307 denoted as "data_in" is coupled to input buffer 303, and input buffer 303 is further coupled to buffered input signal 310 and inverted input signal 309. In some embodiments, buffered input signal 310 and inverted input signal 309 may differentially encode the logic state of data input 307. Voltage shift circuit 304 is coupled to buffered input signal 310 and inverted input signal 309 in addition to first internal signal 311 and second internal signal 312. Output circuit 305 is coupled to first internal signal 311 and second internal signal 312, and is further coupled to first output driver signal 314 and second output driver signal 315. Output driver 306 is coupled to first output driver signal 314, second output driver signal, and data output 316 denoted as "data_out."

Input buffer 303 may include circuitry configured to generate differential versions of data input 307 at the voltage level of power supply 308. In some embodiments, input buffer 303 may include one or more inverters in series to form a non-inverting amplifier. Input buffer 303 may, in other embodiments, include a delay circuit driven by the output of an inverter. The delay circuit may include a capacitor, current-starved inverter, or any other suitable circuit that generates delay.

Static complementary metal-oxide-semiconductor (CMOS) inverters, such as those shown and described herein, may be a particular embodiment of an inverting amplifier that may be employed in the circuits described herein. However, in other embodiments, any suitable configuration of inverting amplifier that is capable of inverting the logical sense of a signal may be used, including inverting amplifiers built using technology other than CMOS.

Voltage shift circuit 304 may be configured to generate first internal signal 311 and second internal signal 312 at the voltage level of power supply 317 dependent upon the buffered input signal 310 and inverted input signal 309. In some embodiments, voltage shift circuit 304 may include a cross-coupled device load, a current mirror load, or any suitable circuit for changing the voltage level of a signal.

Output circuit 305 may include circuitry configured to generate first output driver signal 314 and second output driver signal 315. In some embodiments, output circuit 305 may include at least two inverters in series to form a non-inverting amplifier. Output circuit 305 may, in other embodiments, include a delay circuit driven by the output of an inverter. The delay circuit may include a capacitor, current-starved inverter, or any other suitable circuit that generates delay.

Output driver 306 may be configured to generate data output 316 at the voltage level of power supply 317, dependent upon the output driver signals 314 and 315. In some embodiments, output driver 306 may include one or more push-pull amplifiers, or other suitable amplifier circuit. Feedback devices may, in some embodiments, be employed by output driver 306.

It is noted that the level shift circuit illustrated in FIG. 3 is merely an example. In other embodiments, different circuit blocks and different configurations of circuit blocks may be employed.

Figure 4:
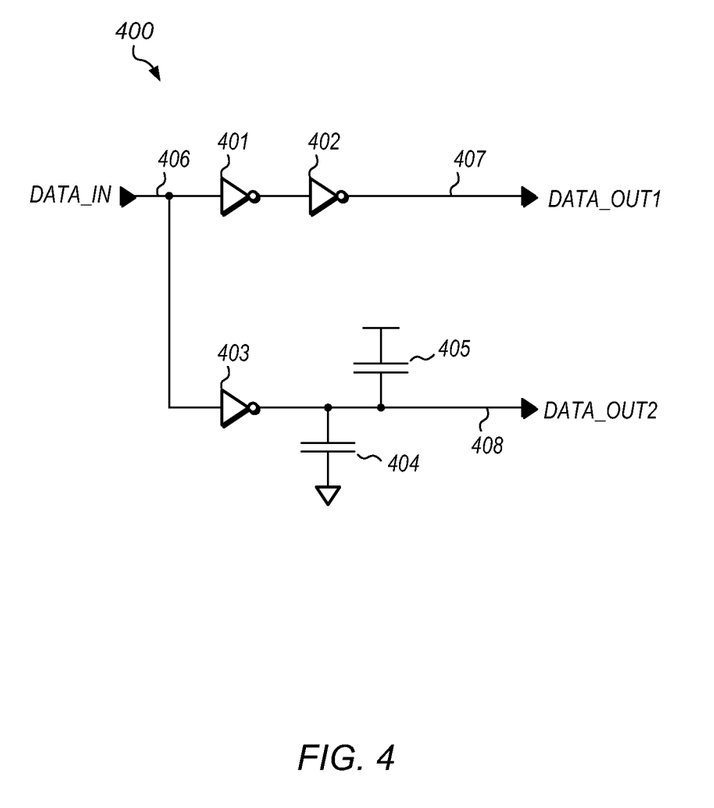
FIG. 4 illustrates an embodiment of an input buffer circuit.

An embodiment of an input buffer is illustrated in FIG. 4. In some embodiments, input buffer 400 may correspond to input buffer 303 of level shift circuit 300 as illustrated in FIG. 3. The illustrated embodiment includes data input 406 denoted as "data_in," first data output 407 denoted as "data_out1," and second data output 408 denoted as "data_out2."

Data input 406 is coupled to the inputs of inverters 401 and 403. The output of inverter 401 is coupled to the input of inverter 402, and the output of inverter 402 is coupled to first data output 407. The output of inverter 403 is coupled to second data output 408, and the output of inverter 403 is coupled to capacitors 404 and 405.

Capacitors 404 and 405 may be implemented as metal-oxide semiconductor field-effect transistors (MOSFETs) whose source and drain terminals are coupled together. In other embodiments, capacitor 404 and capacitor 405 may be implemented as a metal-oxide-metal (MOM) capacitor, a metal-insulator-metal (MIM), or any other suitable type of capacitor.

During operation, a change in the logical state of data input 406 may be transferred to first data output 407 through inverters 401 and 402. The change in the logical state of data input 406 is inverted and coupled to second data output 408 through inverter 403. It is noted that first data output 407 and second data output 408 form a pair of signals that differentially encode the logical state of data input 407.

In some embodiments, the values of capacitors 404 and 405 may be chosen such that the delay from data input 406 to second output 408 is substantially the same as the delay from data input 406 to first data output 407. The additional load provided by capacitors 404 and 405 may, in some embodiments, provide additional load to inverter 403 resulting in additional delay in the path from data input 406 to second output 408. In some embodiments, different delay mechanisms, such as, e.g., current starving inverter 403, or delay circuits may be employed.

Figure 5:
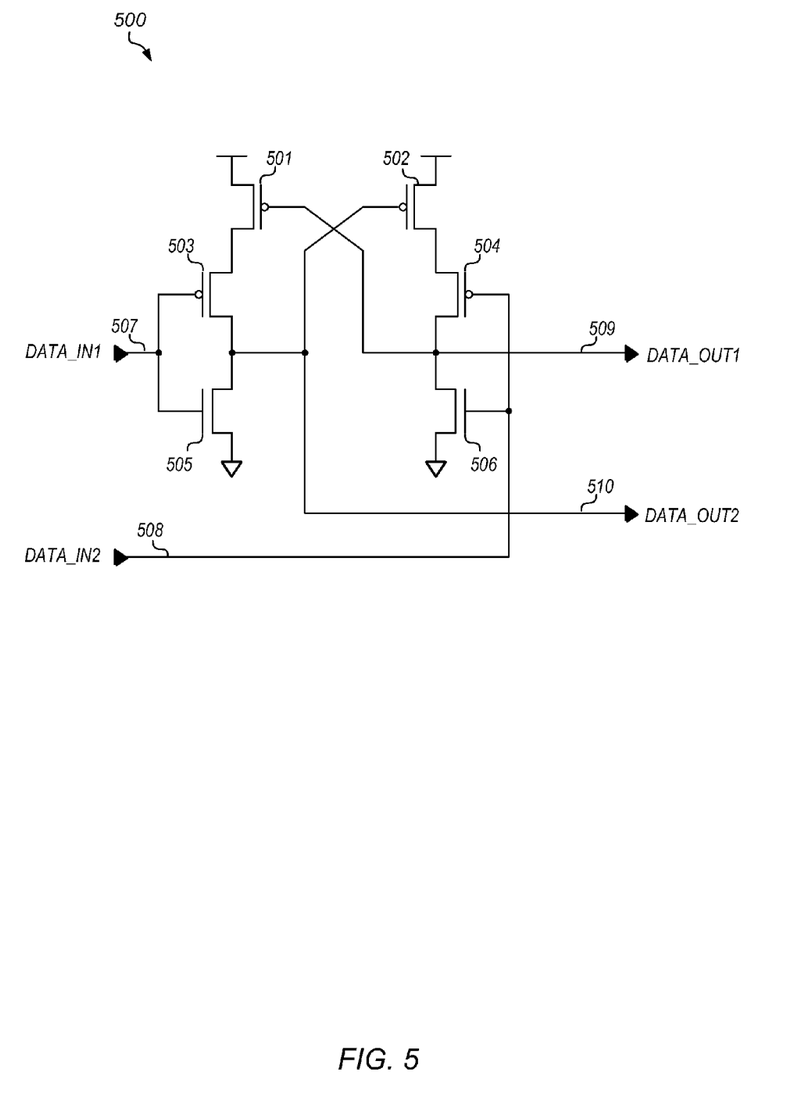
FIG. 5 illustrates an embodiment of a voltage shift circuit.

Turning to FIG. 5, an embodiment of a voltage shift circuit, such as, e.g., voltage shift circuit 304 if level shift circuit 300 as illustrated in FIG. 3, is illustrated. In the illustrated embodiment, voltage shift circuit 500 includes first data input 507 denoted as "data_in1," second data input 508 denoted as "data_in2," first data output 509 denoted as "data_out1," and second data output 510 denoted as "data_out2." In some embodiments, first data input 507 and second data input 508 may correspond to differentially encoded signals 309 and 310 as illustrated in FIG. 3. First output 509 and second data output 510 may, in other embodiments, correspond to first internal signal 311 and second internal signal 312 of level shift circuit 300 as illustrated in FIG. 3.

First data input 507 controls device 503 and pull-down 505, and second data input 508 controls device 504 and pull-down 506. Pull-down device 505 and device 503 are coupled to second data output 510. Device 503 is further coupled to pull-up device 501, which is controlled by first data output 509. Pull-down device 506 and device 504 are coupled to first data output 509. Device 504 is further coupled to pull-up device 502, which is controlled by second data output 510.

It is noted that the term "device" may include one or more transistors, such as, e.g., MOSFETs, or any other suitable transconductance element. It is further noted that a pull-up device may include one or more devices coupled between a circuit node an a positive power supply, and that a pull-down device may include one or more devices coupled between a circuit node and a negative power supply or ground reference node.

In some embodiments, the power supply coupled to pull-up devices 501 and 502 may be at a different voltage level than the high logic level of signals on first data input 507 and second data input 508. The high logic level of signals on first data output 509 and second data output 510 may be substantially the same the voltage level of the power supply coupled to pull-up devices 501 and 502. The power supply coupled to pull-up devices 501 and 502 may, in some embodiments, correspond to power supply 317 of power domain 302 as illustrated in FIG. 3.

During operation, a high logic level on first data input 507 and a logic level on second data input 508 activate devices 505 and 504, respectively. The activation of device 505 discharges second data output 510, resulting a low logic level on second data output 510. The low logic level on second data output 510 activates pull-up device 502, which in turn with activated device 504 results in first data output 509 being charged to the voltage level of the power supply. The resultant high logic level on first data output 509 deactivates pull-up device 501.

In a similar fashion, a low logic level on first data input 507 and a high logic level on second data input 508 results in a low logic level on first data output 509 and a high logic level on second data output 510. In some embodiments, coincident transitions (commonly referred to as "simultaneous switching") on first data input 507 and second data input 508, may result in symmetric switching on first data output 509 and second data output 510. Such coincident transitions on first data input 507 and second data input 508 may result from the operation input 303 or other suitable circuit. Simultaneous switching on first data output 509 and second data output 510 may, in some embodiments, result in less distortion on the output of a level shift circuit, such as level shift circuit 300 as illustrated in FIG. 3.

It is noted that the embodiment of a voltage-shift circuit illustrated in FIG. 5 is merely an example. In other embodiments, different numbers and different configurations of devices are possible and contemplated.

Figure 6:
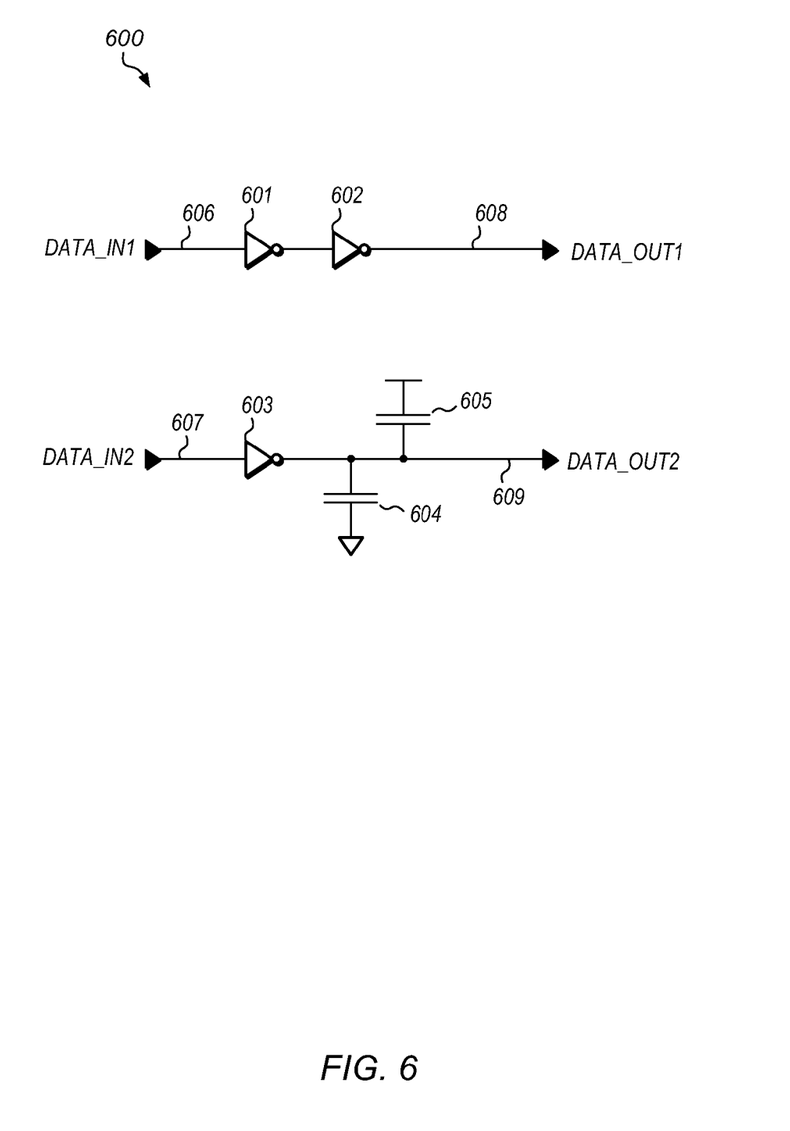
FIG. 6 illustrates an embodiment of an output buffer circuit.

An embodiment of an output buffer circuit is illustrated in FIG. 6. In some embodiments, output buffer 600 may correspond to output buffer 305 of level shift circuit 300 as illustrated in FIG. 3. In the illustrated embodiments, output buffer 600 includes first data input 606 denoted as "data_in1," second data input 607 denoted as "data_in2," first data output denoted as "data_out1," and second data output 609 denoted as "data_out2."

First data input 606 is coupled to inverter 601, and the output of inverter 601 is coupled to inverter 602. The output of inverter 602 is first data output 608. Second data input 607 is coupled inverter 603, whose output is coupled to second data output 609. Capacitors 604 and 605 are also coupled to second data output 609. In some embodiments, capacitors 604 and 605 may be implemented as MOSFETs whose source and drain terminals are connected together. MOM or MIM capacitors may be employed in other embodiments.

Figure 7:
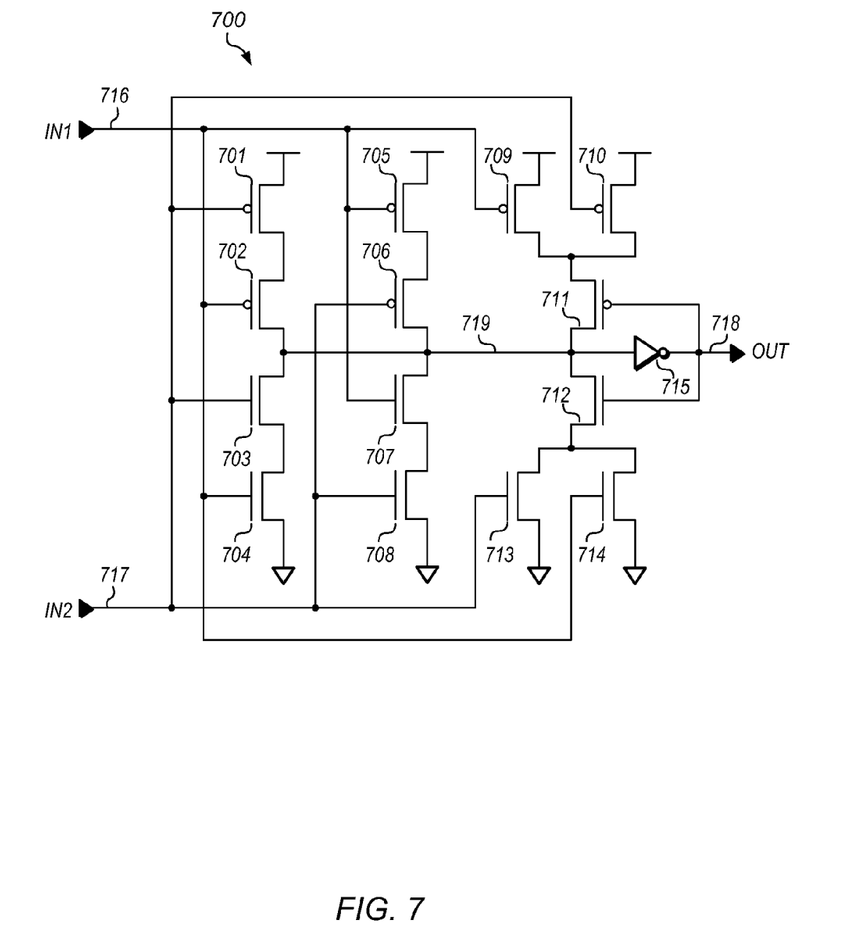
FIG. 7 illustrates an embodiment of an output driver circuit.

Turning to FIG. 7, an embodiment of an output driver circuit is illustrated. In some embodiments, output driver circuit 700 may correspond to output driver 306 in level shift circuit 300 as illustrated in FIG. 3. The illustrated embodiment includes first data input 716 denoted as "in1," second data input 717 denoted as "in2," and output 718 denoted as "out." In some embodiments, first data input 716 and second data input 717 may correspond to first output driver 314 and second output driver 315, respectively. Output 718 may correspond to data output 316. In some embodiments, first data input 716 and second data input 717 may have the same logical polarity.

First data input controls device 702, pull-down device 704, pull-down device 714, pull-up device 705, device 707, and pull-up device 709. Second data input controls device 703, pull-up device 701, device 706, pull-down device 708, pull-down device 713, and pull-up device 710.

Pull-up device 701 is coupled to device 702, and device 702 is further coupled to circuit node 719. Pull-down device 704 is coupled to device 703, and device 702 is further coupled to circuit node 719. Pull-up device 705 is coupled to device 706, and device 706 is further coupled to circuit node 719. Pull-down device 708 is coupled device 707, and device 707 is further coupled to circuit node 719. In some embodiments, devices 702, 703, 706, and 707, pull-up devices 701 and 705, and pull-down devices 704 and 708 may collectively form an inverting amplifier. The arrangement of the aforementioned devices illustrated in FIG. 7 may, in some embodiments, provide balanced loading for first data input 716 and second data input 717, as well as create symmetric rise and fall characteristics on output 718, thereby limiting distortion.

The input of inverter 715 is coupled to circuit node 719, and the output inverter 715 is coupled to output 718, which controls devices 711 and 712. Devices 711 and 712 are both coupled to circuit node 719. Device 711 is further coupled to pull-up device 709 and 710, and device 712 is further coupled to pull-down devices 713 and 714.

During operation a high logic level on first data input 716 and second data input 717 may activate devices 703 and 707 and pull-down devices 704 and 708, thereby discharging circuit node 719 to ground. The high logic level on first data input 716 and second data input may also activate pull-down devices 713 and 714. Inverter 715 generates a high logic level on output 718 in response to the low logic level on circuit node 719. The high logic level on output 718, in turn, deactivates device 711 and activates 712, thereby providing negative feedback of a portion of the signal on output 718 to circuit node 719. The activation of device 712 provides an additional discharge path to ground for circuit node 719 through pulldown devices 713 and 714. Although depicted as a CMOS inverter, inverter 715 may, in other embodiments, be implemented using any suitable inverting amplifier. In some embodiments, the interlocked structure depicted in FIG. 7 may provide more balance rise and fall times while avoiding short circuit current in the event of variation in the arrival times of first data input 716 and second data input 717.

In a similar fashion, a low logic level on first data input 716 and on second data input 717, may result in circuit node 719 being charge to the voltage level of the power supply through devices 702 and 706, and pull-up devices 701 and 705. Inverter 715 generates a low logic level on output 718 in response to the high logic level on circuit node 719. The low logic level activates device 711, thereby providing feedback from output 718 back to circuit node 719. In some embodiments, the use of feedback may prevent circuit node 719 from not being driven when a difference in timing exists between first data input 716 and second data input 717.

It is noted that the circuit illustrated in FIG. 7 is merely an example. In other embodiments, different numbers of circuit elements and different configurations of circuit elements may be employed.

Figure 8:
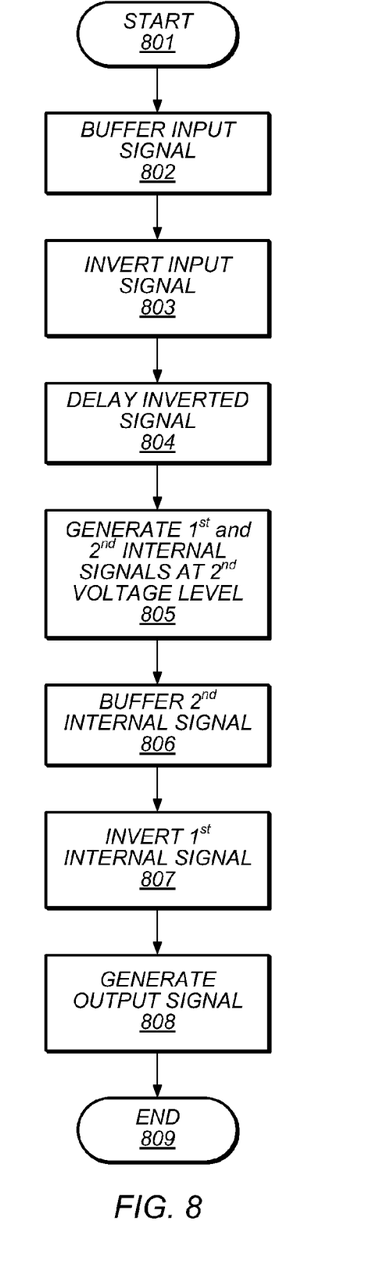
FIG. 8 illustrates a flowchart of an example method of operating a level shift circuit.

A method for operating a level shift circuit, such as level shift circuit 300 as illustrated in FIG. 3, is depicted in the flowchart illustrated in FIG. 8. Referring collectively to level shift circuit 300 as illustrated in FIG. 3, and the flowchart depicted in FIG. 8, the method begins in block 801. Data input 307 may then be buffered (block 802) to create buffered input signal 310 at the voltage level of power supply 308. In some embodiments, input buffer 303 may employ a unity-gain non-inverting amplifier, or other suitable circuit, to buffer data input 307.

The logical polarity of data input 307 may then be inverted (block 803). Input buffer 303 may employ an inverting amplifier, such as, e.g., a CMOS inverter, to invert the logical polarity of data input 307. The inverted version of data input 307 may then be delayed (block 804). In some embodiments, input buffer 303 may employ a delay circuit configured to delay the inverted version of data input 307 such that inverted input 309 and buffered input 310 switch logic states at substantially the same time. The high logic level of inverter input 309 may be at the voltage level of power supply 308.

First internal signal 311 and second internal signal 312 may then be generated at the voltage level of power supply 317 (block 805). In some embodiments, voltage shift circuit may generate first internal signal 311 and second internal signal 312 dependent upon buffered input 310 and delayed input 309. The high logic level of first internal signal 311 and second internal signal may, in some embodiments, may correspond the voltage level of power supply 317.

Second internal signal 312 may then be buffered (block 806) to create output driver signal 314. Output circuit 305 may, in various embodiments, employ a unity-gain non-inverting amplifier to buffer second internal signal 312. The logical polarity of first internal signal 311 may then be inverted, and the resultant signal delayed to create output driver signal 315 (block 807). In some embodiments, output buffer 305 may employ inverting amplifiers and delay circuits, such as those described above in reference to input buffer 303, to generate output driver signal 315.

Data output 316 may then be generated at the voltage level of power supply 317 (block 808). Output driver 306 may, in some embodiments, generate data output 316 dependent upon output driver signals 314 and 315. In other embodiments, the load on output driver signals 314 and 315 within output driver 306 may be balanced such that each of output driver signals 314 and 315 have substantially the same load. Output driver 306 may employ at least two inverting amplifiers, and one or more of the inverting amplifiers may, in some embodiments, employ feedback to improve the operating characteristics of the amplifier. The balanced load within output driver 306, as well as providing simultaneous switching of buffered input 310 and delayed inverted input 309 may, in some embodiments, reduce distortion in data output 316.

In it noted that the method illustrated in FIG. 8, the operations are depicted as being performed in a sequential manner. In other embodiments, one or more of the operations may be performed in parallel.

Numerous variations and modifications will become apparent to those skilled in the art once the above disclosure is fully appreciated. It is intended that the following claims be interpreted to embrace all such variations and modifications.

What is claimed is:

1. An apparatus, comprising:
   an input buffer circuit configured to generate, dependent upon an external signal, a buffered external signal at a first voltage level and a delayed inverted external signal at the first voltage level, wherein the input buffer comprises:
      an inverting amplifier configured to generate an inverted external signal; and
      a delay circuit including one or more capacitors configured to generate the delayed inverted external signal dependent upon the inverted external signal;
   a voltage shift circuit configured to generate a first internal signal at a second voltage level, and a second internal signal at the second voltage level dependent upon the buffered external signal and the delayed inverted external signal; and
   an output circuit coupled to the voltage shift circuit, wherein the output circuit includes:
      an inverting amplifier configured to invert the first internal signal;
      a delay circuit configured to delay the inverted first internal signal; and
      a non-inverting amplifier configured to buffer the second internal signal;
   an output driver configured to generate an output signal at the second voltage level dependent upon the delayed inverted first internal signal and the buffered second internal signal.

2. The apparatus of claim 1, wherein each of the one or more capacitors comprises a metal-oxide semiconductor field-effect transistor (MOSFET), wherein the source terminal of the MOSFET is coupled to the drain terminal of the MOSFET.

3. The apparatus of claim 1, wherein the input buffer further comprises a non-inverting amplifier configured to generate the buffered external signal dependent upon the external signal.

4. The apparatus of claim 1, wherein the output driver circuit comprises one or more feedback devices, wherein each of the one or more feedback devices is controlled by the output signal.

5. A method, comprising:
   buffering an external signal at a first voltage level;
   inverting the external signal;
   delaying the inverted external signal;
   generating a first internal signal at a second voltage level and a second internal signal at the second voltage level dependent upon the buffered external signal and the delayed inverted external signal;
   buffering the second internal signal;

inverting the first internal signal;
delaying the inverted first internal signal, wherein delaying the inverted external signal comprises charging a first capacitor and discharging a second capacitor; and
generating an output signal at the second voltage level dependent upon the buffered second internal signal and the delayed inverted first internal signal.

6. The method of claim 5, wherein the external signal is a clock signal.

7. The method of claim 5, wherein each of the first capacitor and the second capacitor comprises a metal-oxide semiconductor field-effect transistor (MOSFET).

8. The method of claim 5, wherein delaying the inverted first internal signal comprises charging a third capacitor and discharging a fourth capacitor.

9. The method of claim 5, wherein generating the output signal comprises generating an intermediate signal dependent upon the buffered second internal clock signal and the delayed inverted first internal clock signal, and amplifying the intermediate signal.

10. The method of claim 9, wherein amplifying the intermediate signal comprises providing negative feedback dependent upon the output signal.

11. A system, comprising:
a first circuit block coupled to a first power supply, wherein the first circuit block is configured to transmit a logic signal at the voltage level of the first power supply;
a level shift circuit coupled to the first power supply and a second power supply, wherein the level shift circuit is configured to:
receive the logic signal at the voltage level of the first power supply;
buffer the logic signal;
invert the logic signal;
charge a capacitor coupled to the inverted logic signal to delay the inverted logic signal;
generate a first internal signal at the voltage level of the second power supply and a second internal signal at the voltage level of the second power supply dependent upon the buffered logic signal and the delayed inverted logic signal;
buffer the first internal signal;
invert the second internal signal;
delay the inverted second internal signal;
generate an output signal at the voltage level of the second power supply dependent upon the buffered first internal signal and the delayed inverted second internal signal; and
a second circuit block coupled to the second power supply, wherein the second circuit block is configured to receive the output signal.

12. The system of claim 11, wherein the capacitor comprises one or more metal-oxide semiconductor field-effect transistors (MOSFETs), wherein the source terminal and the drain terminal are coupled together for each of the one or more MOSFETs.

13. The system of claim 11, wherein the level shift circuit comprises one or more feedback devices, wherein each feedback device of the one or more feedback devices is controlled by the output signal.

14. The system of claim 11, wherein the voltage level of the first power supply is less than the voltage level of the second power supply.

15. The system of claim 11, wherein the voltage level of the first power supply is higher than the voltage level of the second power supply.

* * * * *